United States Patent
Pokorny

(10) Patent No.: US 6,523,552 B2
(45) Date of Patent: Feb. 25, 2003

(54) FACILITY FOR TREATING OBJECTS IN A PROCESS TANK

(75) Inventor: Joachim Pokorny, Hüfingen (DE)

(73) Assignee: Steag MicroTech GmbH (DE)

( * ) Notice: Subject to any disclaimer, the term of this patent is extended or adjusted under 35 U.S.C. 154(b) by 0 days.

(21) Appl. No.: 09/068,618

(22) PCT Filed: Oct. 16, 1996

(86) PCT No.: PCT/EP96/04487

§ 371 (c)(1),
(2), (4) Date: Jul. 7, 1998

(87) PCT Pub. No.: WO97/17722

PCT Pub. Date: May 15, 1997

(65) Prior Publication Data

US 2001/0008142 A1 Jul. 19, 2001

(30) Foreign Application Priority Data

Nov. 7, 1995 (DE) .......................... 195 41 436

(51) Int. Cl.⁷ ................................. B08B 3/04
(52) U.S. Cl. .................. 134/25.4; 134/36; 134/182; 134/186; 134/902
(58) Field of Search ................. 134/182, 902, 134/155, 186, 25.4, 36; 261/122.1, 124

(56) References Cited

U.S. PATENT DOCUMENTS

| | | | |
|---|---|---|---|
| 2,374,500 A | * | 4/1945 | Reading |
| 3,346,033 A | * | 10/1967 | Olejniczak |
| 3,493,093 A | | 2/1970 | Hammer et al. |
| 3,543,776 A | * | 12/1970 | Latyon |
| 3,575,350 A | * | 4/1971 | Willinger ............... 239/145 |
| 3,644,231 A | * | 2/1972 | Maruya et al. |
| 3,785,779 A | * | 1/1974 | Li et al. |
| 3,853,752 A | * | 12/1974 | Tymoszczuk |

(List continued on next page.)

FOREIGN PATENT DOCUMENTS

| | | | |
|---|---|---|---|
| DE | 4336704 | | 5/1995 |
| DE | 4413077 | | 10/1995 |
| EP | 0385536 | | 9/1990 |
| GB | 2126710 | * | 3/1984 |
| JP | 4-103124 | * | 4/1992 |
| JP | 4-304636 | * | 10/1992 |
| JP | 5-62961 | * | 3/1993 |

OTHER PUBLICATIONS

Jürgen Falbe; "Römpp Chemie Lexikon"; pp 3587–3588.

Wilhelm Foerst, "Ullmanns Encyklopädie . . . Chemie"; 1951; pp 492–493.

Primary Examiner—Frankie L. Stinson
(74) Attorney, Agent, or Firm—R W Becker & Associates; R W Becker

(57) ABSTRACT

A processing tank has at least one fluid distribution device for introducing a treatment fluid. The fluid distribution device has at least one porous hollow rod, at least one porous plate, at least one capillary plate, or at least one single-ply or multi-ply fabric.

10 Claims, 2 Drawing Sheets

U.S. PATENT DOCUMENTS

| | | | |
|---|---|---|---|
| 3,857,910 A | * | 12/1974 | Day |
| 3,915,862 A | * | 10/1975 | Moloney |
| 3,941,862 A | * | 3/1976 | Price et al. .................. 261/122 |
| 3,981,273 A | * | 9/1976 | Buss ............................. 119/3 |
| 4,092,176 A | * | 5/1978 | Kozai et al. |
| 4,145,287 A | * | 3/1979 | Walker et al. |
| 4,201,691 A | * | 5/1980 | Asher et al. ................ 252/314 |
| 4,332,455 A | * | 6/1982 | Stettner |
| 4,361,163 A | * | 11/1982 | Aigo |
| 4,541,928 A | * | 9/1985 | Seymour |
| 4,852,596 A |   | 8/1989 | Fry et al. |
| 4,889,620 A | * | 12/1989 | Schmit et al. |
| 4,960,546 A | * | 10/1990 | Tharp |
| 5,014,727 A | * | 5/1991 | Aigo .......................... 134/102 |
| 5,039,349 A |   | 8/1991 | Schoeppel |
| 5,069,235 A |   | 12/1991 | Vetter et al. |
| 5,071,488 A | * | 12/1991 | Takayama et al. ............ 134/34 |
| 5,268,035 A | * | 12/1993 | Neubauer et al. |
| 5,356,570 A | * | 10/1994 | Golob et al. |
| 5,474,616 A | * | 12/1995 | Hiyami et al. ................ 134/32 |
| 5,513,722 A | * | 5/1996 | Foltz ........................ 184/55.2 |
| 5,518,620 A | * | 5/1996 | Eguchi et al. .............. 210/615 |
| 5,540,247 A | * | 7/1996 | Kawatani et al. ........... 134/182 |
| 5,697,391 A | * | 12/1997 | Segawa |
| 5,868,971 A | * | 2/1999 | Meyer |

\* cited by examiner

FACILITY FOR TREATING OBJECTS IN A PROCESS TANK

BACKGROUND OF THE INVENTION

The present invention relates to a device for treatment of objects in a processing.

Devices of this kind are employed for manufacturing semiconductor components and chips in various designs and are, for example, known from printed documents U.S. Pat. No. 3,493,093, European patent application 385 536 or German patent application 44 13 077 and German patent application 195 00 239 of the same applicant as the present application as well as German patent application 43 26 704 or U.S. Pat. No. 4,852,596. The treatment fluids or media are introduced in the known devices via one or more inlet openings into the processing tank and are removed via one or more outlet openings from the processing tank. The singular inlet and/or outlet openings distribute the treatment fluid, in most cases a liquid or a gas, non-uniformly within the processing tank or in the processing chamber. Thus, it is not possible to provide a uniform flow distribution and a flow that is as laminar as possible over the entire cross-section of the processing reservoir, respectively, the treatment chamber.

It is therefore an object of the invention to provide a device for chemical treatment of objects in a processing tank which allows for an improved fluid, respectively, pressure distribution and with which a laminar flow or flow distribution over the entire cross-section of a processing tank and/or a processing chamber is possible.

SUMMARY OF THE INVENTION

With the present invention, an improved fluid and pressure distribution of the introduced, respectively, removed treatment fluid, preferably a liquid, a gas, a liquid/gas mixture or a gas/vapor mixture, within the processing tank or the treatment chamber above the processing tank is possible so that over the entire cross-section of the processing reservoir and/or the treatment chamber a uniform flow distribution and a laminar flow is achieved. The substrates to be treated within the processing tank are thus subjected more uniformly to the treatment fluid so that a more uniform treatment result independent of the position of the individual substrates within the processing tank is possible and improved treatment or process results can be achieved.

The objects provided for treatment are, for example, substrates, silicone discs, wafers, ceramic or metal and/or glass substrates, for example, LCDs.

The fluid distribution device is comprised of at least one porous hollow rod, at least one porous plate, at least one capillary plate and/or at least a single-ply or multi-ply fabric whereby these fluid distribution devices are preferably made of plastic, ceramic material, quartz, quartz glass and/or metal.

The fluid distribution devices are preferably welded into the processing tank, screwed thereto and/or clamped therein, whereby preferably between the fluid distribution devices and the wall of the processing tank seals are provided in order to prevent that undefined flow will result when the treatment fluid passes between the fluid distribution device and the processing tank wall.

In the case that the fluid distribution device is comprised of a single-ply or multi-ply fabric, it is advantageous for fastening and manipulation of the fabric to clamp or weld it into a frame and to insert the frame supporting the fabric into the processing tank and to fasten it thereto. The frame can be comprised of the same material as the fabric so that it is possible in a simple manner to fuse the fabric to the frame.

When supplying a treatment fluid from the bottom of the processing tank, it is advantageous to position the fluid distribution device transverse to the flow direction of the fluid, preferably substantially parallel to the processing tank bottom and in its vicinity. When a treatment fluid, for example, a treatment gas is introduced, optionally in addition to the introduction of a treatment fluid, for example, a liquid at the bottom of the processing tank, from above via a hood of the processing tank into the tank, it is advantageous to arrange the fluid distribution device substantially parallel to the cover of the hood and in its vicinity between the inlet opening or inlet openings and the treatment chamber.

In order to achieve a more uniform fluid and pressure distribution of the introduced treatment fluid over the entire cross-section of the processing tank or the processing chamber, according to a further embodiment of the invention it is suggested, when introducing the treatment fluid at the bottom of the processing tank, to provide at least one porous tube and furthermore at least one porous plate, at least on capillary plate and/or at least one fabric. In the case of introducing a treatment fluid via the hood of the processing tank, preferably at least one porous tube and, arranged below, at least one porous plate, at least one capillary plate and/or at least one fabric are provided.

This also advantageous when at, respectively, before the outlet of the treatment fluid at least one porous plate, at least one capillary plate and/or at least one fabric are provided. This provides for a fluid and pressure distribution as uniform as possible with respect to the outlet flow.

Especially advantageous is a fluid distribution device for the fluid outlet in the case that the processing tank is open at the top and the treatment fluid is removed by flowing over one or more sides of the processing tank, as is, for example, the case in the German patent applications 44 130 077 and 195 00 239, owned by the applicant. By arranging the fluid distribution device, especially at least one porous plate, at least one capillary plate and/or at least one fabric at the open surface of the processing tank, an especially uniform fluid or pressure distribution and thus a laminary fluid flow within the processing tank over the entire cross-section of the processing tank with respect to the outlet flow is provided so that turbulence and non-uniform surface flow is reduced. When in this context at the bottom of the processing tank into which the fluid is introduced fluid distribution device is provided, a closed processing chamber with laminary inner flow results between the fluid distribution device at the bottom and the fluid distribution device provided at the open area of the processing tank with respect to the distribution of fluid, flow and pressure.

The fluid distribution device provided at the open area of the processing tank is advantageously sealed relative to the processing tank wall. Especially advantageous is the arrangement of the fluid distribution device in a detachable manner to the open area of the processing tank in order to be able to introduce the substrates to be treated and the substrate carrier into the processing tank and to remove them therefrom.

The present invention is especially advantageous in connection with a processing tank for etching, cleaning, flushing or drying substrates or other objects or for the surface treatment with chemicals. The processing tank can be used for a single step as well as multiple step process.

BRIEF DESCRIPTION OF THE DRAWINGS

The invention as well as further advantages and embodiments will be explained in the following with the aid of the preferred embodiment making reference to the Figures. It is shown in.

DESCRIPTION OF PREFERRED EMBODIMENTS

Figure 1:
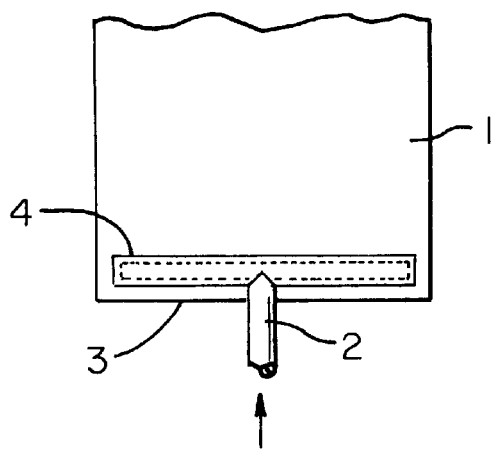
FIG. 1 a schematic representation of a processing tank with a fluid distribution device in the form of a porous hollow rod.

In the embodiment represented in FIG. 1 a fluid is introduced into the interior of the processing tank by line 2 at the bottom 3 of the processing tank 1 and is introduced into a porous hollow rod 4. The introduced fluid is distributed therein substantially over the entire cross-section of the processing tank and flows from the porous openings of the hollow rod over the entire cross-section of the processing tank 1 uniformly and with substantially identical pressure so that, accordingly, it has a laminar and uniform flow in the upward direction.

Figure 2:
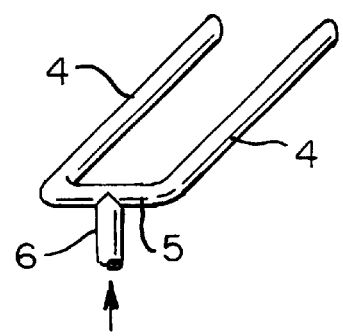
FIG. 2 a schematic representation of a further embodiment of the porous hollow rod.

The fluid distribution device represented in FIG. 2 comprises two parallel extending porous hollow rods which are connected at one side by a transverse tube 5 having at its center portion a line 6 through which the fluid is introduced. Further possibilities of the embodiment of such fluid distribution devices with porous hollow rods are such that the two free parallel extending hollow rods are connected by a transverse tube and are also used for introducing the fluid. Of course, it is also possible to position more than two porous hollow rods parallel to one another or to arrange two crossed porous hollow rods.

Figure 3:
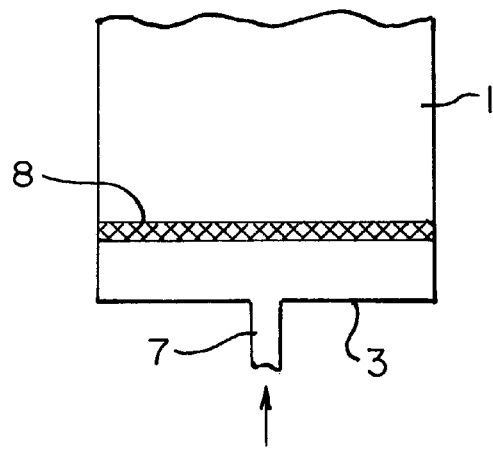
FIG. 3 a schematic representation of a processing tank with a porous plate as a fluid distribution device.

The embodiment represented in FIG. 3 shows the fluid being introduced via a line through the opening 7 into the processing tank 1. Parallel to the processing tank bottom 3 a porous plate 8, a capillary plate or a single-ply or multi-ply fabric is arranged via which the treatment fluid introduced via opening 7 into the processing tank 1 is distributed over the entire cross-sectional area of the processing tank 1 and flows with substantially uniform pressure distribution into the actual treatment area of the processing tank 1.

Figure 4:
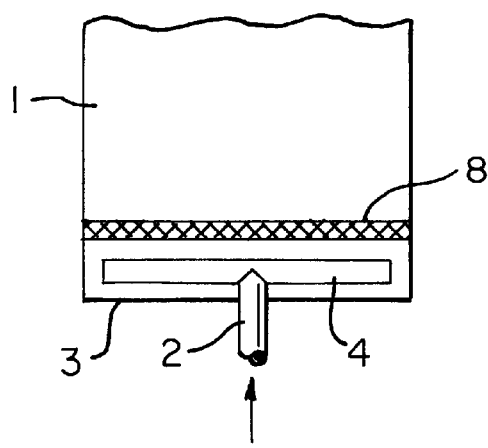
FIG. 4 a schematic representation of a processing tank, in which two fluid distribution devices in the form of one or more porous tubes and in the form of a porous plate are provided.
Figure 5:
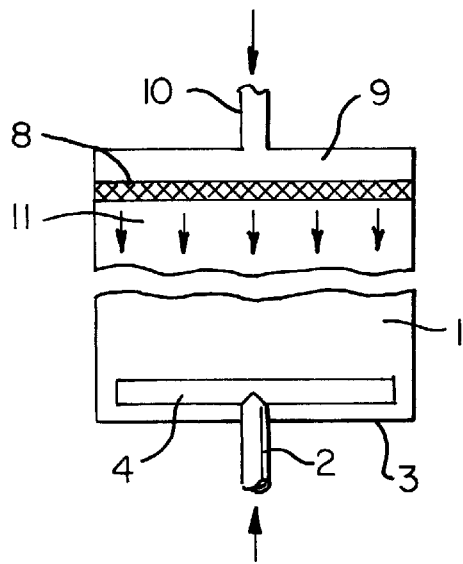
FIG. 5 an embodiment in a schematic representation in which a fluid distribution device in the form of a porous tube at the fluid tank bottom as well as a fluid distribution device in the form of a porous plate in the hood are provided.

In the embodiment represented in FIG. 4 the embodiments of FIGS. 1 and 3 are combined in order to provide a more improved and more uniform flow and pressure distribution of the treatment fluid introduced at the bottom of the processing tank over the entire cross-sectional area of the processing tank 1. Above the porous hollow rod, respectively, above the porous hollow rods in this embodiment, a porous plate, a capillary plate or a single-ply or a multi-ply fabric 8 is arranged parallel thereto. In the embodiment represented in FIG. 5 a treatment fluid, preferably a liquid, is introduced via line 2 and one or more porous hollow rods 4 into the processing tank 1 according to the embodiment of FIG. 1. The processing tank 1 comprises furthermore a hood 9 into which from above via a further inlet opening 10 a further treatment fluid, preferably a gas or a gas/vapor mixture, is introduced into the processing tank 1, respectively, into the treatment chamber 11 above the processing tank. Between the treatment chamber 11 and the inlet opening 10 a porous plate, a capillary plate and/or a single-ply or multi-ply fabric 8 is provided in correspondence to the embodiment according to FIG. 3. They provide a uniform distribution of the treatment fluid flowing in via the inlet opening 10 over the entire cross-sectional area of the processing tank 1, respectively, the treatment chamber 11 in the same manner as in the embodiment of FIG. 3. A processing tank 1 with hood 9 is shown only schematically in the embodiment according to FIG. 5. However, this is disclosed in detail in German application 44 13 077 and German application 19 500 239, and reference is made to these printed documents in order to avoid repetition.

Figure 6:
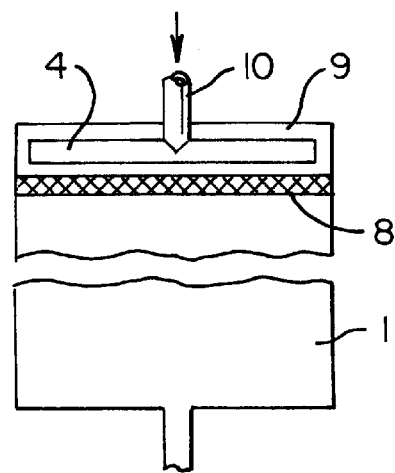
FIG. 6 an embodiment in a schematic representation in which the porous tube as well as the porous plate are provided parallel to one another within the hood.

The embodiment represented in FIG. 6 corresponds substantially to the afordescribed embodiment of FIG. 4, which according to the embodiment of FIG. 6 is provided with a hood 9. Downstream of the inlet opening 10 for a gas or gas/vapor mixture, at least one porous hollow rod 4 and below a porous plate, a capillary plate, or a fabric 8 is arranged in order to achieve according to the embodiment of FIG. 4 within the hood 9, respectively, in the treatment chamber 11, respectively, between it and the processing tank 1, a uniform pressure and flow distribution of the treatment fluid introduced into the hood 9.

Figure 7:
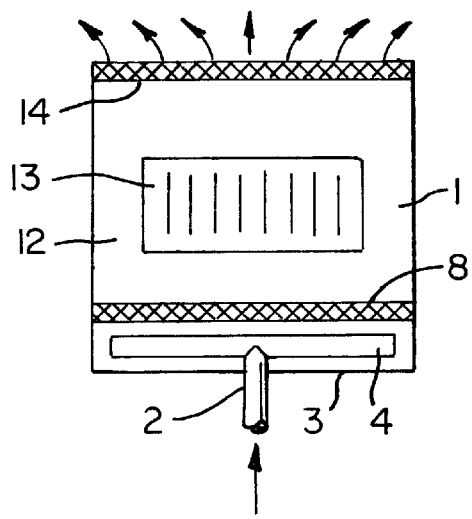
FIG. 7 an embodiment in a schematic representation for a processing tank with fluid overflow, in which above the fluid inlet bottom a porous tube and a porous plate and at the upper open area a further porous plate are arranged.

FIG. 7 shows an embodiment of a processing tank 1 in which the fluid according to the embodiment according to FIG. 4 is introduced via inlet opening 2 at the bottom 3 of the processing tank 1 via at least one porous hollow rod 4 as well as a porous plate arranged parallel thereto or a capillary plate or a fabric 8 into the processing chamber 12 of the processing tank 1 in which the object or objects 13 to be treated, for example, semiconductor substrates arranged in supports, carriers, or receiving members.

In this embodiment the "lid" of the tank is a porous plate, a capillary plate, or a fabric 14 provided at the open area of the processing tank 1 which affects at the outlet a laminary flow and prevents or reduces non-uniform surface flows at the open surface of the fluid bath. Accordingly, within the treatment chamber 12 of the processing tank 1 a closed processing chamber with uniform laminary inner flow is provided so that it is ensured that the objects contained therein and to be treated are subjected to the treatment fluid independent of their position or arrangement relative to the cross-section of the processing tank 1 in a uniform and identical manner.

Figure 8:
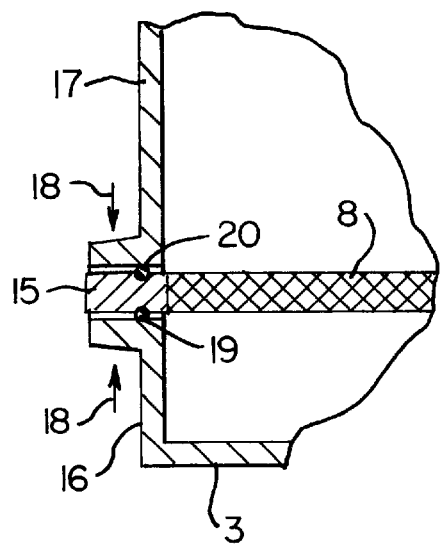
FIG. 8 an embodiment in a schematic representation for receiving and fastening a porous plate, a capillary plate, or a fabric within a frame, respectively, at the processing tank.

The schematic partial representation of FIG. 8 shows a fluid distribution device in the form of a single-ply or multi-ply fabric or a capillary or porous material 8 that is clamped in a frame 15 or fastened thereto. As can be seen from the partial cross-sectional representation, the frame 15 of the fluid distribution device 8 is arranged between a processing tank bottom portion 16, comprising the processing tank bottom 3, and a processing tank top portion 17, and clamped between these parts 16 and 17, for example, by bolts, screws etc. according to the schematically represented arrows 18. Between the processing tank bottom portion 3 and the frame 15 as well as between the processing tank top portion 17 and the frames 15 a respective seal (19, 20), for example, an O ring, is provided for sealing the processing tank 1.

The fluid distribution device 8 provided with a frame 15 is arranged according to the embodiments of FIGS. 3, 4, or 7, parallel to the bottom 3 of the processing tank 1 in the vicinity of the inlet opening or openings for introducing these fluids. Corresponding to the embodiments according to FIGS. 5 and 6, it is also possible to arrange and fasten the frame 15 supporting the fluid distribution device 8 in a hood 9 in the manner disclosed in FIG. 8.

The advantage of a fluid distribution device 8 having a frame 15 supporting it according to the embodiment of FIG. 8 is especially to be seen in that the fluid distribution device 8 is embodied in the form of a single-ply or multi-ply fabric, a porous plate, or a capillary plate over the entire cross-section of the processing tank so that even in the area of the processing tank side walls a laminary flow of the fluid as uniform as possible is ensured. The embodiment represented in FIG. 8 has furthermore the advantage that the attachment and exchange of such fluid distribution devices 8 is simple and fast.

The invention has been described with the aid of preferred embodiments. However, to a person skilled in the art modifications and further embodiments of the disclosed examples are obvious without deviating from the gist of the invention. For example, it is possible to provide at the inlet openings between the processing tank 1 and the hood 9 media distribution devices for the treatment fluid introduced via the hood 9 in order to improve the flow and pressure distribution of the treatment fluid upon introduction.

The present invention is, of course, in no way restricted to the specific disclosure of the specification and drawings, but also encompasses any modifications within the scope of the appended claims.

What is claimed is:

1. An apparatus for introducing a fluid to a processing tank and for uniform liquid and pressure distribution within said processing tank, the apparatus comprising:
   at least one porous hollow rod connected to an inlet opening of the processing tank; and
   at least one porous divider comprising sealed edges to the processing tank dividing a top portion of the processing tank from a bottom portion of the processing tank.

2. The invention of claim 1 wherein said porous lid also comprises sealed edges.

3. The invention of claim 1 wherein said porous divider comprises a member selected from the group consisting of a porous plate, a capillary plate and a fabric.

4. The invention of claim 1 wherein said porous lid comprises a member selected from the group consisting of a porous plate, a capillary plate and a fabric.

5. The apparatus of claim 1, wherein said at least one porous hollow rod comprises a transverse tube and a plurality of parallel porous hollow rods connected to said transverse tube.

6. A method of introducing a fluid into a processing tank, the method comprising the steps of:
   introducing the fluid through at least one porous hollow rod assembly through at least one inlet to the processing tank; and
   circulating the fluid through a sealed porous processing tank divider and a porous lid.

7. The method of claim 6 wherein the porous lid comprises a sealed porous lid.

8. The method of claim 6 wherein the sealed porous processing tank divider comprises a member selected from the group consisting of a porous plate, a capillary plate and a fabric.

9. The method of claim 6 wherein the porous lid comprises a member selected from the group consisting of a porous plate, a capillary plate and a fabric.

10. The method of claim 6 wherein the at least one porous hollow rod comprises a transverse tube and a plurality of parallel porous hollow rods connected to said transverse tube.

* * * * *